(12) United States Patent
Morita et al.

(10) Patent No.: US 10,395,844 B2
(45) Date of Patent: Aug. 27, 2019

(54) CAPACITOR COMPONENT

(71) Applicant: Murata Manufacturing Co., Ltd., Nagaokakyo-shi, Kyoto-fu (JP)

(72) Inventors: Yoshitsugu Morita, Nagaokakyo (JP); Nagato Omori, Nagaokakyo (JP); Atsushi Sakuragi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/724,574

(22) Filed: Oct. 4, 2017

(65) Prior Publication Data

US 2018/0096794 A1   Apr. 5, 2018

(30) Foreign Application Priority Data

Oct. 4, 2016   (JP) .................................. 2016-196165

(51) Int. Cl.
| | |
|---|---|
| *H01G 4/012* | (2006.01) |
| *H01G 4/232* | (2006.01) |
| *H01G 4/30* | (2006.01) |
| *H01G 4/38* | (2006.01) |
| *H05K 1/11* | (2006.01) |

(Continued)

(52) U.S. Cl.
CPC ............... *H01G 4/38* (2013.01); *H01G 4/012* (2013.01); *H01G 4/232* (2013.01); *H01G 4/30* (2013.01); *H05K 1/113* (2013.01); *H05K 1/142* (2013.01); *H05K 1/181* (2013.01); *H01G 4/248* (2013.01); *H05K 3/368* (2013.01); *H05K 2201/10015* (2013.01); *H05K 2201/10378* (2013.01); *H05K 2201/10522* (2013.01); *H05K 2201/10636* (2013.01); *Y02P 70/611* (2015.11)

(58) Field of Classification Search
CPC ........... H01G 2/06; H01G 4/12; H01G 4/012; H01G 4/232; H01G 4/30; H01G 4/38; H01G 4/40; H01G 4/248; H05K 1/11; H05K 1/18; H05K 1/113; H05K 1/142; H05K 1/181; H05K 3/301; H05K 3/368; H05K 2201/10015; H05K 2201/10378; H05K 2201/10522; H05K 2201/10636; Y02P 70/611
USPC ........... 174/260; 257/691, E23.153; 438/599
See application file for complete search history.

(56) References Cited

U.S. PATENT DOCUMENTS 9,337,138 B1 * 5/2016 Abugharbieh ...... H01L 23/5385
2004/0066589 A1 * 4/2004 Togashi .................. H01G 2/065
361/15

(Continued)

FOREIGN PATENT DOCUMENTS

JP   2004-134430 A   4/2004
JP   2009-283490 A   12/2009

(Continued)

Primary Examiner — Timothy J Thompson
Assistant Examiner — Guillermo J Egoavil
(74) Attorney, Agent, or Firm — Keating & Bennett, LLP

(57) ABSTRACT

A capacitor component includes multilayer ceramic capacitors and an interposer board on which the multilayer ceramic capacitors are mounted. The interposer board is provided with four or more lands that are electrically connected to the corresponding external electrodes of the multilayer ceramic capacitors, an input terminal, and an output terminal, and each of the four or more lands is electrically connected to one of the input terminal and the output terminal.

18 Claims, 12 Drawing Sheets

(51) Int. Cl.
    *H05K 1/18*     (2006.01)
    *H05K 1/14*     (2006.01)
    *H01G 4/248*     (2006.01)
    *H05K 3/36*     (2006.01)

(56) References Cited

U.S. PATENT DOCUMENTS

| | | | |
|---|---|---|---|
| 2013/0201615 A1 | 8/2013 | Arnold et al. | |
| 2015/0302992 A1* | 10/2015 | Lee | H01G 4/30 174/260 |
| 2016/0007446 A1* | 1/2016 | Ishikawa | H05K 1/113 174/260 |
| 2016/0126013 A1* | 5/2016 | Park | H01G 4/30 174/260 |
| 2016/0309578 A1* | 10/2016 | Park | H01G 4/30 |
| 2017/0290161 A1* | 10/2017 | Shimura | H01G 4/12 |

FOREIGN PATENT DOCUMENTS

| | | |
|---|---|---|
| JP | 2012-043947 A | 3/2012 |
| JP | 2015-509659 A | 3/2015 |

\* cited by examiner

CAPACITOR COMPONENT

CROSS REFERENCE TO RELATED APPLICATIONS

This application claims the benefit of priority to Japanese Patent Application No. 2016-196165 filed on Oct. 4, 2016. The entire contents of this application are hereby incorporated herein by reference.

BACKGROUND OF THE INVENTION

1. Field of the Invention

The present invention relates to a capacitor component including a plurality of multilayer ceramic capacitors.

2. Description of the Related Art

A capacitor component including a plurality of laminate capacitors for various purposes is known, such as to increase capacitance. As such a capacitor component, Japanese Patent Application Laid-Open No. 2012-43947 describes a capacitor component with a structure in which a second multilayer capacitor is stacked on a first multilayer capacitor, and the first multilayer capacitor is mounted on a mounting board.

Unfortunately, the capacitor component described in Japanese Patent Application Laid-Open No. 2012-43947 has a structure in which the second multilayer capacitor is stacked on the first multilayer capacitor while being aligned with the first multilayer capacitor in a stacking direction, so that manufacture thereof is difficult, and there are restrictions on the size of the first multilayer capacitor and the second multilayer capacitor, being required to be substantially identical to each other.

SUMMARY OF THE INVENTION

Preferred embodiments of the present invention provide capacitor components that not only reduce restrictions on the size of a multilayer ceramic capacitor itself, but also are able to be easily manufactured.

A capacitor component according to a preferred embodiment of the present invention includes a plurality of multilayer ceramic capacitors, and an interposer board on which the plurality of multilayer ceramic capacitors are mounted, wherein the interposer board includes four or more lands that are electrically connected to respective external electrodes of the corresponding plurality of multilayer ceramic capacitors, an input terminal, and an output terminal, and the four or more lands each are electrically connected to one of the input terminal and the output terminal.

The capacitor component may preferably be configured such that each of the input terminal and the output terminal is provided on a back surface of the interposer board, the back surface is one of two sides of the interposer board, opposite to a front surface on which the lands are provided, the input terminal extends from the back surface to a first side surface of the interposer board, and the output terminal extends from the back surface to a second side surface opposite to the first side surface.

The capacitor component may preferably be configured such that the input terminal includes a portion that is provided on the first side surface to electrically connect the lands provided on the front surface of the interposer board and the input terminal to each other, and that is defined by a via conductor that is exposed to the first side surface, and the output terminal includes a portion that is provided on the second side surface to electrically connect the lands provided on the front surface of the interposer board and the output terminal to each other, and that is defined by a via conductor that is exposed to the second side surface.

The capacitor component may preferably be configured such that at least one of the lands being electrically connected to the input terminal, in the four or more lands, extends to a first end edge of the interposer board, and at least one of the lands being electrically connected to the output terminal extends to a second end edge opposite to the first end edge.

The capacitor component may preferably be configured, for example, such that the interposer board has a dimension not less than about 3.5 mm and not more than about 10.0 mm in its longitudinal direction, and a dimension not less than about 2.8 mm and not more than about 5.0 mm in its lateral direction orthogonal or substantially orthogonal to the longitudinal direction, and a ratio of the dimension in the longitudinal direction to the dimension in the lateral direction is not less than about 1.2 and not more than about 2.0.

According to various preferred embodiments of the present invention, the plurality of multilayer ceramic capacitors are configured to be mounted on the mounting board with the input terminal and the output terminal provided on the interposer board interposed therebetween while being mounted on the interposer board, the plurality of multilayer ceramic capacitors do not need to be directly connected to each other at the time of manufacture, which facilitates the manufacture. In addition, the plurality of multilayer ceramic capacitors are configured to be mounted on the interposer board, so that the plurality of multilayer ceramic capacitors do not need to be identical or substantially identical to each other in size, which enables a reduction in restrictions on size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
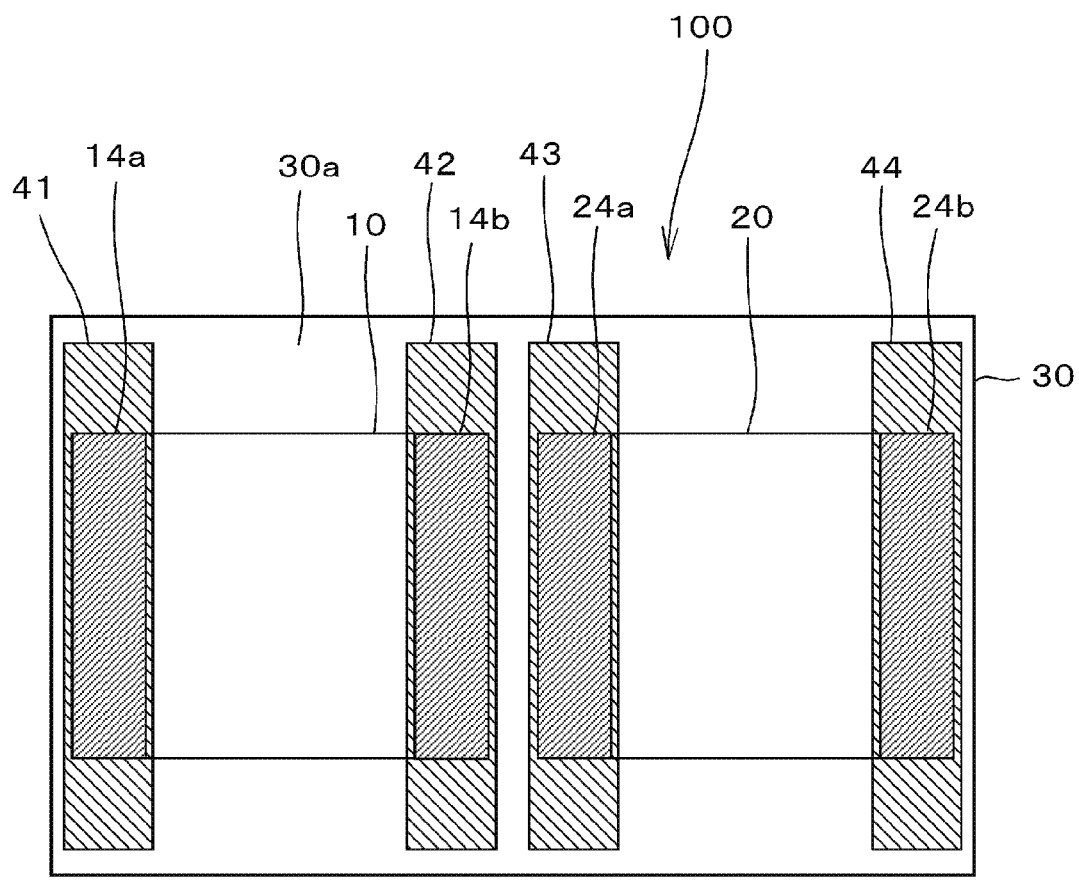
FIG. 1 is a top view of a capacitor component in a first preferred embodiment of the present invention.

Preferred embodiments of the present invention will be described below with reference to the drawings to more specifically describe features of the present invention.
First Preferred Embodiment FIG. 1 is a top view of a capacitor component 100 in a first preferred embodiment of the present invention. The capacitor component 100 in the first preferred embodiment includes a first multilayer ceramic capacitor 10, a second multilayer ceramic capacitor 20, and an interposer board 30 on which the first multilayer ceramic capacitor 10 and the second multilayer ceramic capacitor 20 are mounted.

Figure 2:
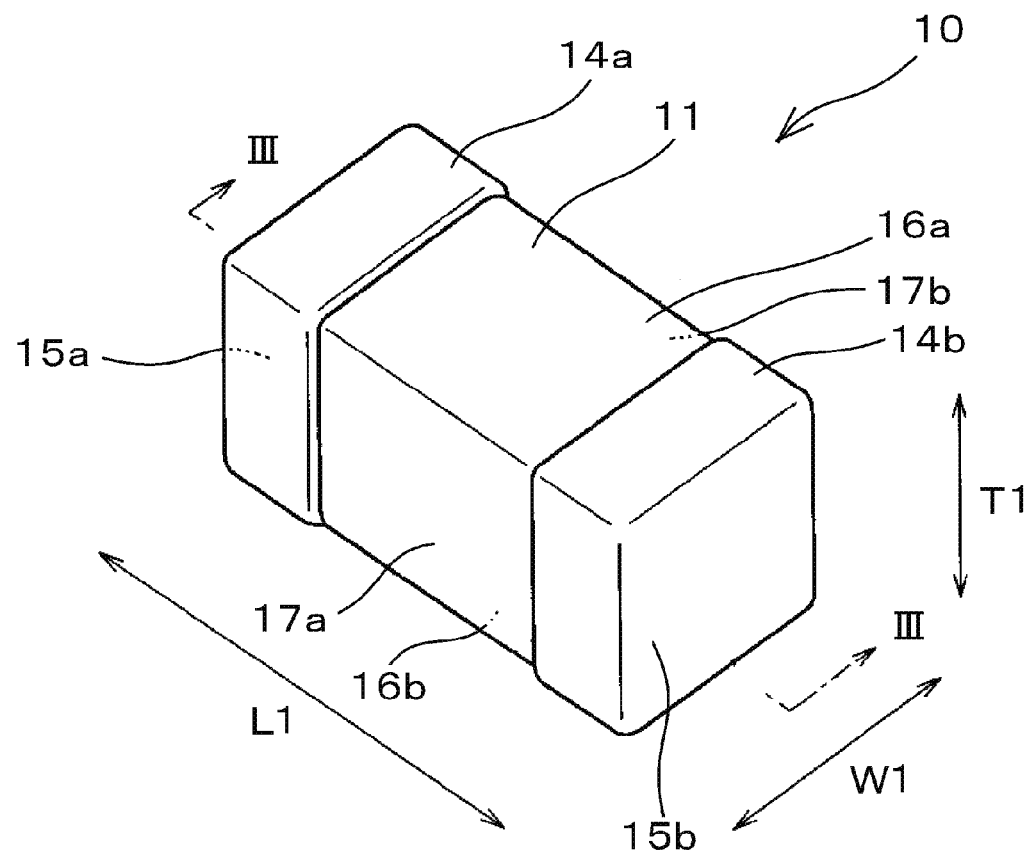
FIG. 2 is a perspective view of a first multilayer ceramic capacitor.
Figure 3:
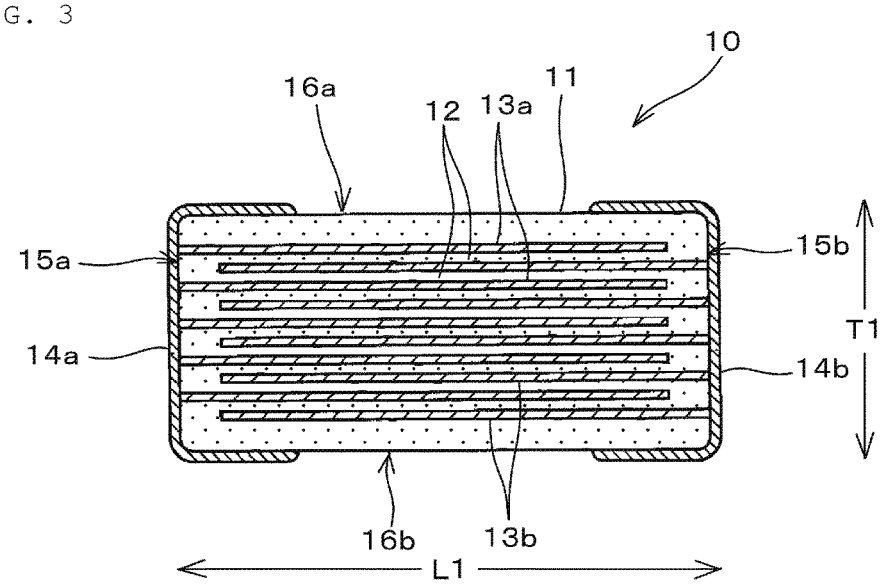
FIG. 3 is a sectional view of the first multilayer ceramic capacitor illustrated in FIG. 2, taken along line III-III.

FIG. 2 is a perspective view of the first multilayer ceramic capacitor 10. FIG. 3 is a sectional view of the first multilayer ceramic capacitor 10 illustrated in FIG. 2, taken along line III-III. While a structure of the first multilayer ceramic capacitor 10 will be described below, the second multilayer ceramic capacitor 20 has the same or substantially the same structure as that of the first multilayer ceramic capacitor 10.

The first multilayer ceramic capacitor 10 includes a laminate 11, and a pair of external electrodes 14a and 14b.

The laminate 11 includes a plurality dielectric layers 12 made of dielectric ceramics that are alternately stacked, first internal electrodes 13a that extend to a first end surface 15a of the laminate 11, and second internal electrodes 13b that extend to a second end surface 15b thereof. That is, the plurality of dielectric layers 12, and the plurality of first and second internal electrodes 13a and 13b, are alternately stacked to provide the laminate 11.

The external electrode 14a is not only provided on all of the first end surface 15a of the laminate 11, but also extends to a first principal surface 16a, a second principal surface 16b, a first side surface 17a, and a second side surface 17b from the first end surface 15a. The external electrode 14a is electrically connected to the first internal electrodes 13a.

The external electrode 14b is not only provided on all of the second end surface 15b of the laminate 11, but also extends to the first principal surface 16a, the second principal surface 16b, the first side surface 17a, and the second side surface 17b from the second end surface 15b. The external electrode 14b is electrically connected to the second internal electrodes 13b.

Figure 4A:
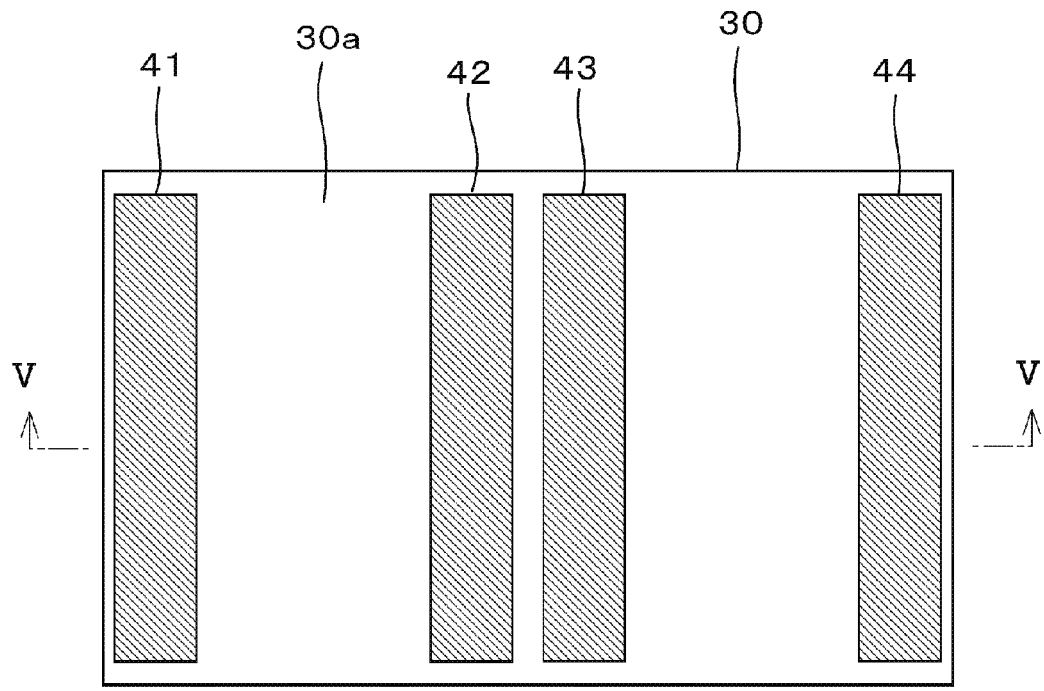
FIGS. 4A and 4B illustrate an interposer board of a capacitor component, FIG. 4A illustrating a front surface in both sides of the interposer board, on which a multilayer ceramic capacitor is mounted, and FIG. 4B illustrating a back surface opposite to the front surface on which a multilayer ceramic capacitor is mounted.
Figure 4B:
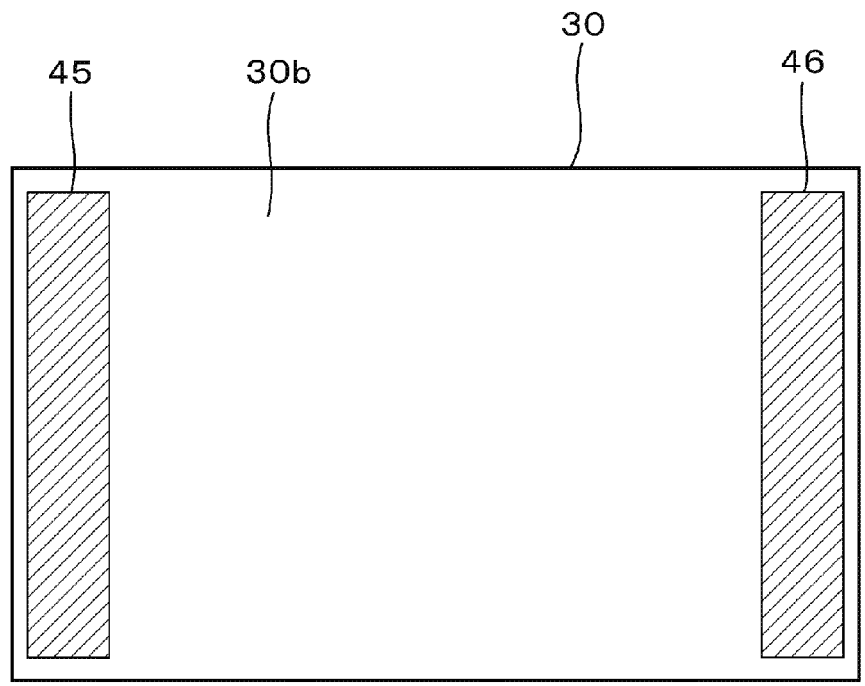

FIGS. 4A and 4B illustrate the interposer board 30 of the capacitor component 100. FIG. 4A illustrates a front surface 30a on both sides of the interposer board 30, on which multilayer ceramic capacitors 10 and 20 are mounted, and FIG. 4B illustrates a back surface 30b opposite to the front surface 30a on which the multilayer ceramic capacitors 10 and 20 are mounted.

On the front surface 30a of the interposer board 30, a first land 41, a second land 42, a third land 43, and a fourth land 44 are provided.

The first multilayer ceramic capacitor 10 is mounted so as to extend over the first land 41 and the second land 42 of the interposer board 30. Specifically, as illustrated in FIG. 1, the external electrode 14a of the first multilayer ceramic capacitor 10 is provided on the first land 41, and the external electrode 14b thereof is provided on the second land 42. As a result, the external electrode 14a of the first multilayer ceramic capacitor 10 is electrically connected to the first land 41 of the interposer board 30, and the external electrode 14b thereof is electrically connected to the second land 42 thereof.

The second multilayer ceramic capacitor 20 is mounted so as to extend over the third land 43 and the fourth land 44 of the interposer board 30. Specifically, as illustrated in FIG. 1, the external electrode 24a of the second multilayer ceramic capacitor 20 is provided on the third land 43, and the external electrode 24b thereof is provided on the fourth land 44. As a result, the external electrode 24a of the second multilayer ceramic capacitor 20 is electrically connected to the third land 43 of the interposer board 30, and the external electrode 24b thereof is electrically connected to the fourth land 44 thereof.

The interposer board 30 is provided with one input terminal 45 and one output terminal 46. In the present preferred embodiment, the input terminal 45 and the output terminal 46 are provided on the back surface 30b of the interposer board 30.

Each of the first land 41, the second land 42, the third land 43, and the fourth land 44 is electrically connected to one of the input terminal 45 and the output terminal 46.

In the present preferred embodiment, the first land 41 and the third land 43 are electrically connected to the input terminal 45, and the second land 42 and the fourth land 44 are electrically connected to the output terminal 46.

Figure 5:
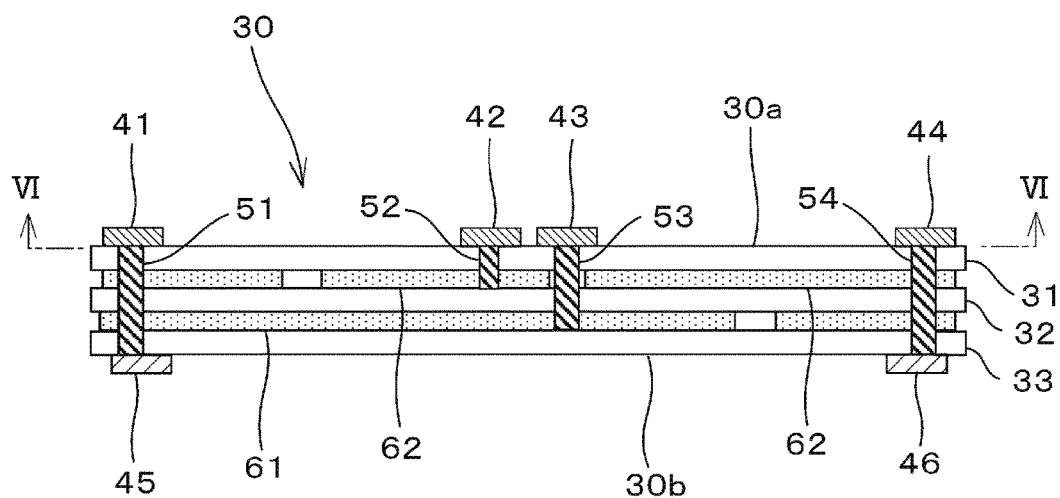
FIG. 5 is a sectional view of the interposer board illustrated in FIG. 4, taken along line V-V.
Figure 6:
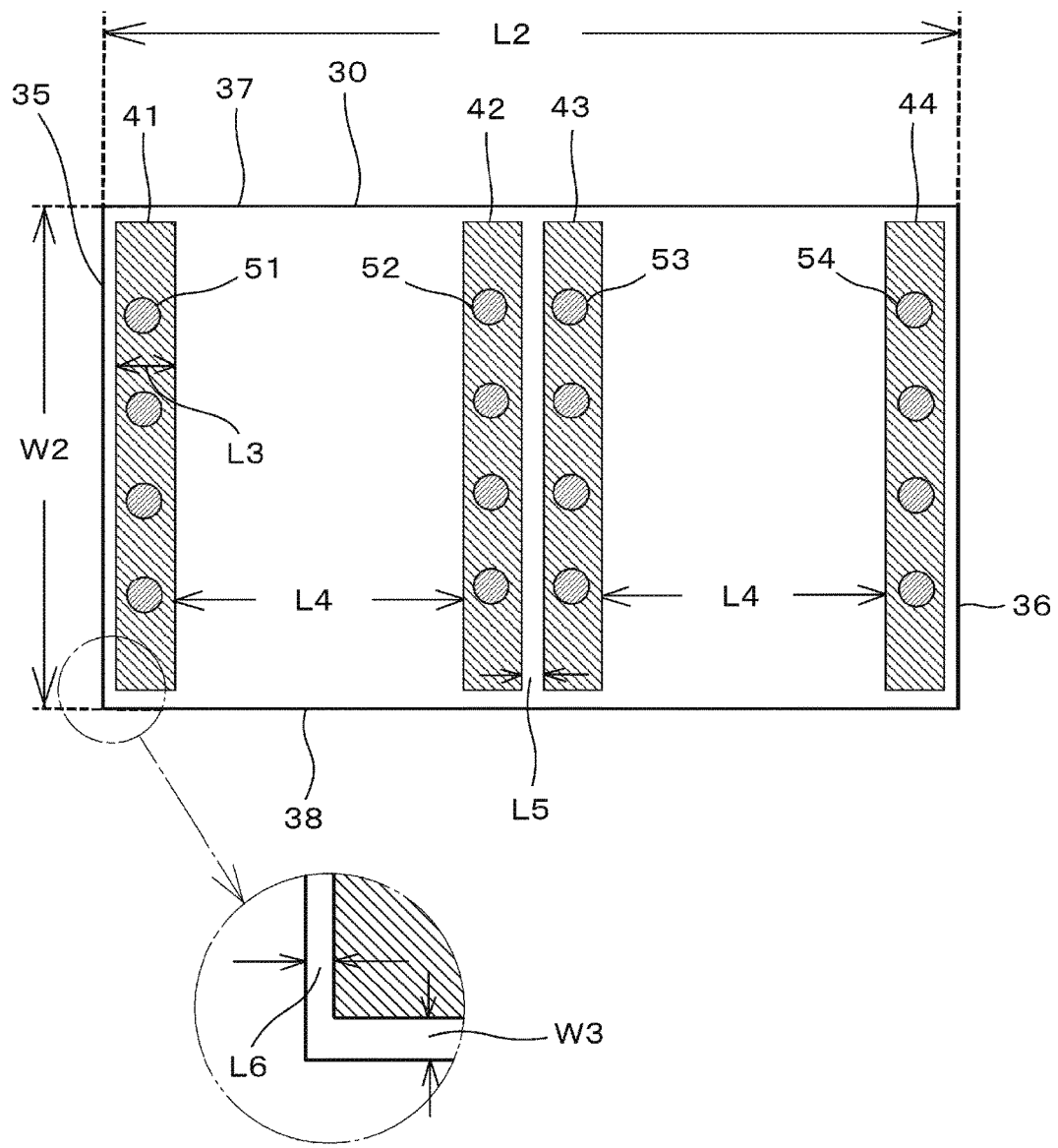
FIG. 6 is a sectional view of the interposer board illustrated in FIG. 5, taken along line VI-VI.

FIG. 5 is a sectional view of the interposer board 30 illustrated in FIG. 4, taken along line V-V. FIG. 6 is a sectional view of the interposer board 30 illustrated in FIG. 5, taken along line VI-VI.

As illustrated in FIG. 5, the interposer board 30 in the present preferred embodiment preferably includes a first board 31, a second board 32, and a third board 33 that are stacked. However, the structure of the interposer board 30 is not limited to the structure illustrated in FIG. 5.

The first board 31 is provided with the first land 41, the second land 42, the third land 43, and the fourth land 44. That is, the front surface 30a of the interposer board 30 illustrated in FIG. 4A is a front surface of the first board 31.

The third board 33 is provided with the input terminal 45 and the output terminal 46. That is, the back surface 30b of the interposer board 30 illustrated in FIG. 4B is a back surface of the third board 33.

The second board 32 is disposed between the first board 31 and the third board 33.

The interposer board 30 includes a first via conductor 51, a second via conductor 52, a third via conductor 53, a fourth via conductor 54, a first copper wire 61, and a second copper wire 62.

The first via conductor 51 passes through the first board 31, the second board 32, and the third board 33 to electrically connect the first land 41 and the input terminal 45 to each other.

The second via conductor 52 is provided at a position under the second land 42 and passes through the first board 31. The third via conductor 53 is provided at a position under the third land 43 and passes through the first board 31 and the second board 32. The fourth via conductor 54 passes through the first board 31, the second board 32, and the third board 33 to electrically connect the fourth land 44 and the output terminal 46 to each other.

The first copper wire 61 is disposed between the second board 32 and the third board 33 to be electrically connected to the first via conductor 51 and the third via conductor 53. The second copper wire 62 is disposed between the first board 31 and the second board 32 to be electrically connected to the second via conductor 52 and the fourth via conductor 54.

The first land 41 on the first board 31 is electrically connected to the input terminal 45 through the first via conductor 51.

The third land 43 is electrically connected to the first land 41 through the third via conductor 53, the first copper wire 61, and the first via conductor 51. That is, the first land 41 and the third land 43 are electrically connected to the input terminal 45.

The fourth land 44 is electrically connected to the output terminal 46 through the fourth via conductor 54.

The second land 42 is electrically connected to the fourth land 44 through the second via conductor 52, the second copper wire 62, and the fourth via conductor 54. That is, the second land 42 and the fourth land 44 are electrically connected to the output terminal 46.

As described above, the first multilayer ceramic capacitor 10 is mounted on the first land 41 and the second land 42 of the interposer board 30, and the second multilayer ceramic capacitor 20 is mounted on the third land 43 and the fourth land 44 of the interposer board 30. As is evident from the first land 41 and the third land 43 that are electrically connected to each other, as well as from the second land 42 and the fourth land 44 that are electrically connected to each other, the first multilayer ceramic capacitor 10 and the second multilayer ceramic capacitor 20 are connected in parallel.

An example of a preferable size of the capacitor component 100 in the present preferred embodiment will be described.

However, a size of the capacitor component 100 is not limited to the size described below.

In the first multilayer ceramic capacitor 10 and the second multilayer ceramic capacitor 20, a direction in which the pair of external electrodes 14a and 14b face each other is a lengthwise direction, a stacked direction of the dielectric layer 12 and the inside electrodes 13a and 13b is a thickness direction, and a direction orthogonal or substantially orthogonal to each of the lengthwise direction and the thickness direction is a width direction. In this case, preferably, a dimension L1 in the lengthwise direction is about 3.2 mm, a dimension W1 in the width direction is about 2.5 mm, and a dimension T1 in the thickness direction is about 2.5 mm, for example.

It is preferable that the interposer board 30 has a dimension L2 not less than about 3.5 mm and not more than about 10.0 mm in its longitudinal direction, and a dimension W2 not less than about 2.8 mm and not more than about 5.0 mm in its lateral direction orthogonal or substantially orthogonal to the longitudinal direction, and a ratio of the dimension L2 in the longitudinal direction to the dimension W2 in the lateral direction is not less than about 1.2 and not more than about 2.0, for example. Here, the interposer board 30 preferably has a dimension L2 of about 7.3 mm in the longitudinal direction, a dimension W2 of about 4.3 mm in the lateral direction, a thickness of about 0.1 mm, and a ratio of about 1.7 of the dimension L2 in the longitudinal direction to the dimension W2 in the lateral direction, for example.

Each of the first land 41 to the fourth land 44 preferably has a width L3 of about 0.5 mm, for example. A distance L4 between the first land 41 and the second land 42, as well as a distance L4 between the third land 43 and the fourth land 44 is preferably about 2.4 mm, and a distance L5 between the second land 42 and the third land 43 is preferably about 0.3 mm, for example.

In the longitudinal direction of the interposer board 30, a distance L6 between the first land 41 and a first end edge 35 of the interposer board 30, as well as a distance between the fourth land 44 and a second end edge 36 of the interposer board 30 is preferably about 0.1 mm, for example. In the lateral direction of the interposer board 30, a distance W3 between each of the first land 41 to the fourth land 44, and each of a third end edge 37 and a fourth end edge 38 of the interposer board 30 is preferably about 0.15 mm, for example.

The interposer board 30 is provided with the first via conductor 51 to the fourth via conductor 54 each preferably having a diameter of about 0.3 mm, for example. In addition, each of the first copper wire 61 and the second copper wire 62, provided in the interposer board 30, preferably has a thickness of about 0.035 mm, for example.

Figure 7:
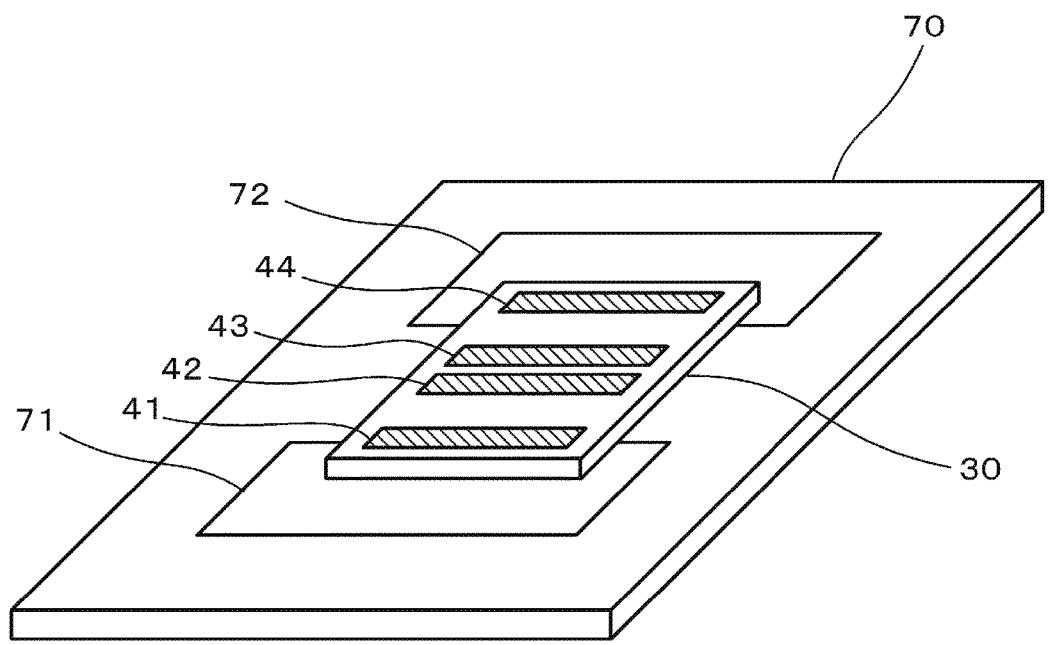
FIG. 7 illustrates a capacitor component mounted on a mounting board while a plurality of multilayer ceramic capacitors is eliminated.

The capacitor component 100 in the present preferred embodiment is mounted on a mounting board 70 (refer to FIG. 7). In FIG. 7, the first multilayer ceramic capacitor 10 and the second multilayer ceramic capacitor 20 are eliminated.

As illustrated in FIG. 7, the mounting board 70 is provided with a first mount land 71 and the second mount land 72. The capacitor component 100 is mounted by soldering, for example, such that the input terminal 45 is electrically connected to the first mount land 71, and the output terminal 46 is electrically connected to the second mount land 72.

While only the pair of mount lands 71 and 72 used to mount the capacitor component 100 are provided on the mounting board 70 in FIG. 7, a plurality of mount lands and wires used to mount a plurality of electronic components may be provided, for example.

The capacitor component 100 in the present preferred embodiment is designed such that a terminal pitch between the input terminal 45 and the output terminal 46 of the interposer board 30 is a dimension suitable for a mounted land pitch between the first mount land 71 and the second mount land 72, provided on the mounting board 70. As a result, even if a multilayer ceramic capacitor has a distance between a pair of external electrodes, or an electrode pitch, less than a mounted land pitch of the mounting board 70, the multilayer ceramic capacitor is able to be mounted on the mounting board 70 with the interposer board 30 interposed therebetween.

When the first multilayer ceramic capacitor 10 and the second multilayer ceramic capacitor 20 are mounted on the interposer board 30, the capacitors are able to be easily connected in parallel. Thus, for example, the second multilayer ceramic capacitor does not need to be stacked on the first multilayer ceramic capacitor in order to provide a parallel connection, so that it is easy to manufacture a capacitor component in which a plurality of multilayer ceramic capacitors are connected in parallel.

While a conventional method for stacking a plurality of multilayer ceramic capacitors in a perpendicular or substantially perpendicular direction to a mounting board causes an increase in a dimension in the perpendicular or substantially perpendicular direction, or a dimension in a height direction, the capacitor component 100 in the present preferred embodiment includes a plurality of multilayer ceramic capacitors that are mounted on the interposer board 30 to enable a reduction in a dimension in the height direction.

The capacitor component 100 in the present preferred embodiment achieves a low ESR and a low ESL, as compared to a polyelectrolyte capacitor having substantially the same size.

Figure 8A:
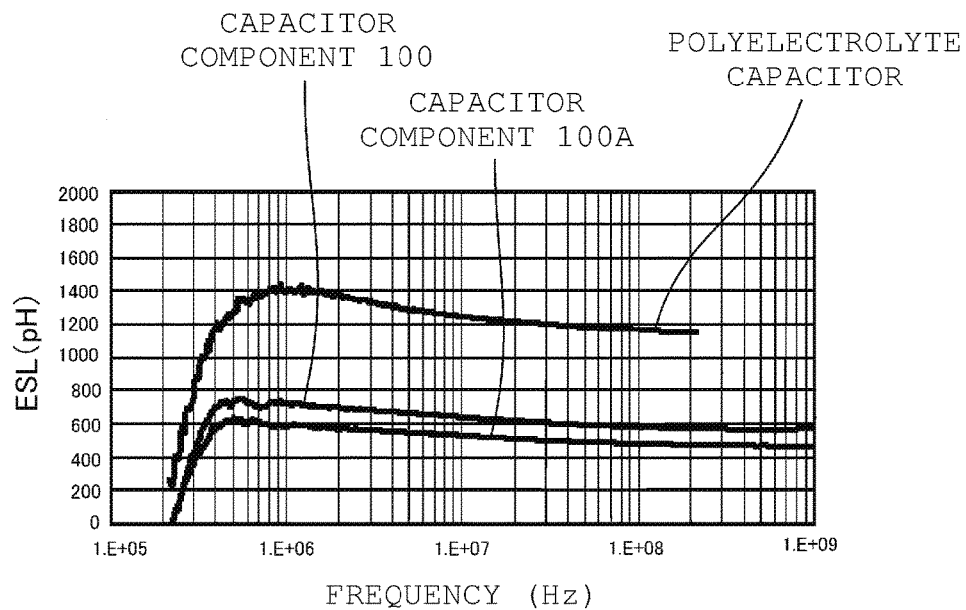
FIGS. 8A and 8B are graphs showing equivalent series resistance (ESR) and equivalent series inductance (ESL), studied by simulation of the capacitor component in the first preferred embodiment of the present invention, a capacitor component with a modified structure of the first preferred embodiment of the present invention, and a polyelectrolyte capacitor being a comparison object, FIG. 8A showing a relationship between frequency and the ESL, and FIG. 8B showing a relationship between frequency and the ESR.
Figure 8B:
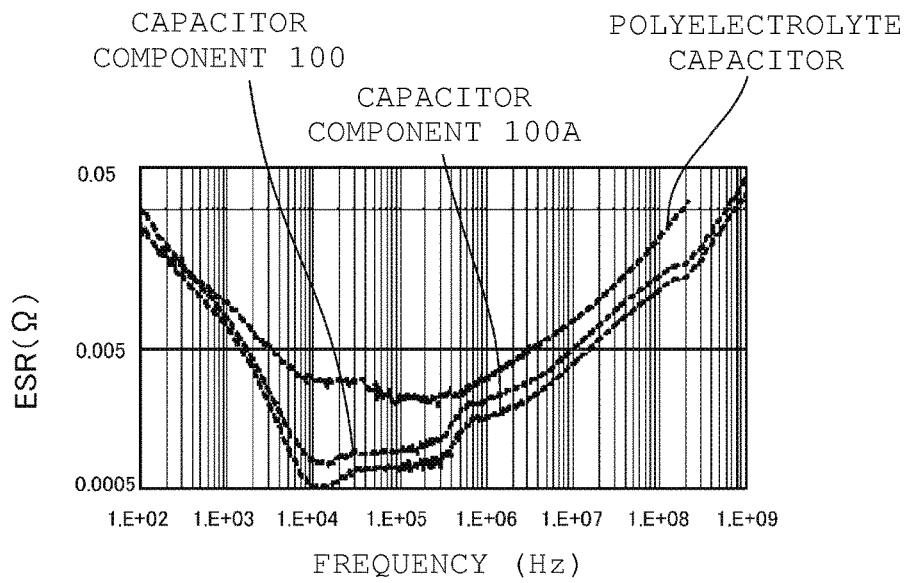

FIG. 8 are graphs showing equivalent series resistance (ESR) and equivalent series inductance (ESL), produced by simulation of the capacitor component 100 in the first preferred embodiment, a capacitor component 100A with a modified structure of the first preferred embodiment, described below, and a polyelectrolyte capacitor being a comparison object. FIG. 8A shows a relationship between frequency and the ESL, and FIG. 8B shows a relationship between frequency and the ESR.

The capacitor component 100 used for the simulation has a capacitance of about 330 μF, for example, and includes the interposer board 30 having a dimension L2 of about 7.3 mm in the longitudinal direction, and a dimension W2 of about 4.3 mm in the lateral direction; and two multilayer ceramic capacitors 10 and 20 each having a dimension L1 of about 3.2 mm in the lengthwise direction, a dimension W1 of about 2.5 mm in the width direction, and a dimension T1 of about 2.5 mm in the thickness direction, for example. The capacitor component 100 has an ESL of about 580 pH at a frequency of 100 MHz.

The capacitor component 100A in the modified structure of the first preferred embodiment, described below, has a structure in which four multilayer ceramic capacitors are mounted on an interposer board. The capacitor component 100A used for the simulation has a capacitance of about 220 μF, for example, and includes an interposer board having a size identical or substantially identical to that of the interposer board 30 described above, and four multilayer ceramic capacitors each having a dimension of about 3.2 mm in the lengthwise direction, a dimension of about 1.6 mm in the width direction, and a dimension of about 1.6 mm in the thickness direction, for example. The capacitor component 100A has an ESL of about 480 pH at a frequency of about 100 MHz.

The polyelectrolyte capacitor being a comparative example used for the simulation has a dimension of about 7.3 mm in the lengthwise direction, a dimension of about 4.3 mm in the width direction, and a dimension of about 1.9 mm in the height direction, for example. The polyelectrolyte capacitor has an ESL of about 1170 pH at a frequency of 100 MHz.

That is, the capacitor component 100 in the present preferred embodiment, as well as the capacitor component 100A in the modified structure of the first preferred embodiment, described below, have an ESL at frequency of 100 MHz that is one-half or less of that of a polyelectrolyte capacitor having the same or substantially the same size as that of the interposer board in plan view. In addition, as illustrated in FIG. 8A, the capacitor component 100 in the present preferred embodiment as well as the capacitor component 100A in the modified structure of the first preferred embodiment have a lower ESL at not only a frequency of 100 MHz, but also another frequency, than that of the polyelectrolyte capacitor having the same or substantially the same size as that of the interposer board in plan view.

Further, as illustrated in FIG. 8B, the capacitor component 100 in the present preferred embodiment as well as the capacitor component 100A in the modified structure of the first preferred embodiment have a lower ESR than that of the polyelectrolyte capacitor having the same or substantially the same size as that of the interposer board in plan view.

Thus, when the capacitor component 100 in the present preferred embodiment or the capacitor component 100A in the modified structure of the first preferred embodiment, each of which has a low ESR and a low ESL, is used instead of a polyelectrolyte capacitor, it is possible to improve the performance of a product in which the capacitor component is mounted.

Modified Structure of First Preferred Embodiment

As long as the number of multilayer ceramic capacitors mounted on the interposer board 30 is two or more, the number is not particularly limited. Thus, as described above, two multilayer ceramic capacitors may be mounted, or three or more multilayer ceramic capacitors may be mounted.

Figure 9:
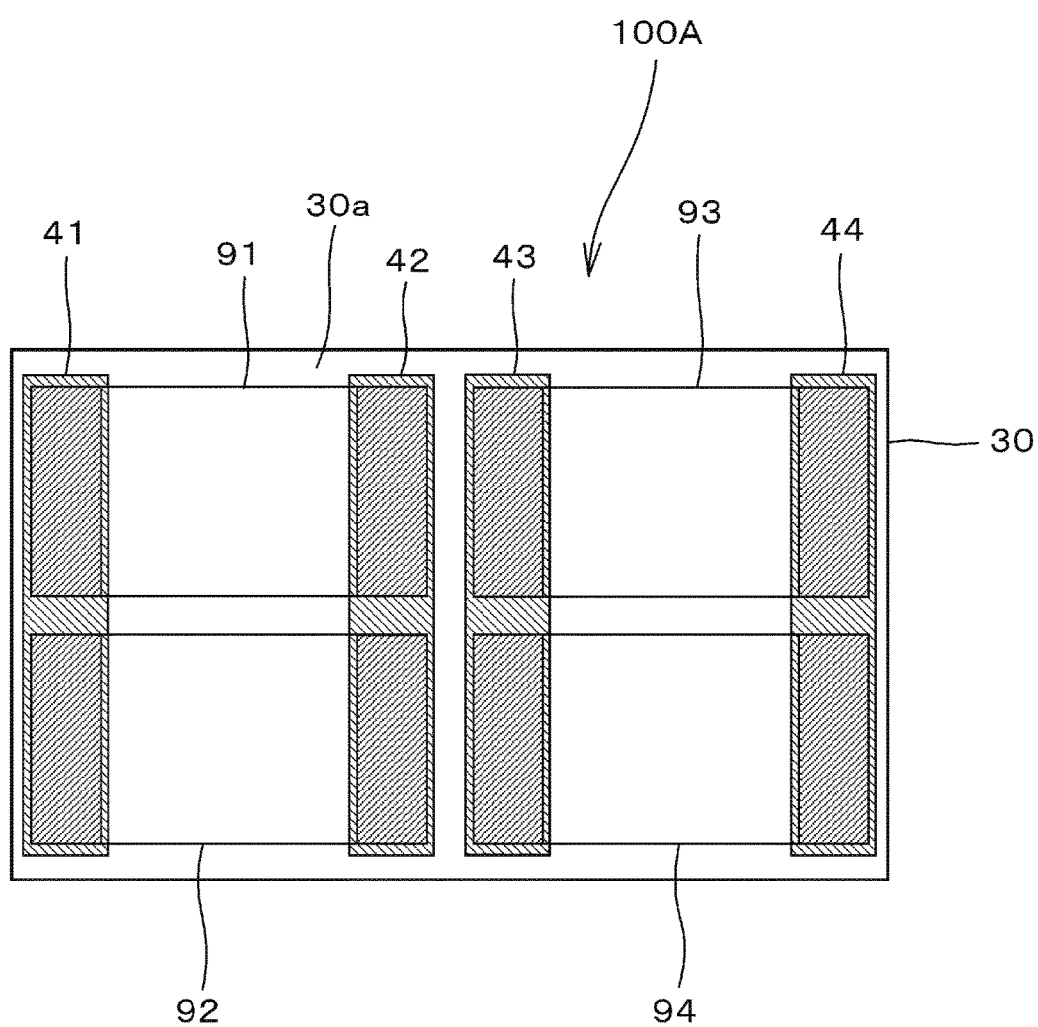
FIG. 9 is a top view of a capacitor component in a modified structure of the first preferred embodiment of the present invention, in which four multilayer ceramic capacitors are mounted on an interposer board.

FIG. 9 is a top view of a capacitor component 100A in a modified structure of the first preferred embodiment, in which four multilayer ceramic capacitors 91 to 94 are mounted on an interposer board 30. The multilayer ceramic capacitors 91 and 92 are mounted on a first land 41 and a second land 42 of the interposer board 30, and the multilayer ceramic capacitors 93 and 94 are mounted on a third land 43 and a fourth land 44 of the interposer board 30. This case also enables the four multilayer ceramic capacitors 91 to 94 to be connected in parallel.

Second Preferred Embodiment

In the capacitor component 100 in the first preferred embodiment described above, the input terminal 45 and the output terminal 46 are provided on the back surface 30b of the interposer board 30.

In a capacitor component 200 in a second preferred embodiment of the present invention, an input terminal and an output terminal are provided not only on a back surface of an interposer board but also on a side surface thereof.

In the capacitor component 200 in the second preferred embodiment, the structure of a first multilayer ceramic capacitor and a second multilayer ceramic capacitor, mounted on an interposer board, as well as a connection relationship between the interposer board and the two multilayer ceramic capacitors, are the same or substantially the same as those of the capacitor component 100 in the first preferred embodiment. Thus, portions of an interposer board 300 of the capacitor component 200 in the second preferred embodiment that are different from those of the interposer board 30 described in the first preferred embodiment, will primarily be described below.

Figure 10:
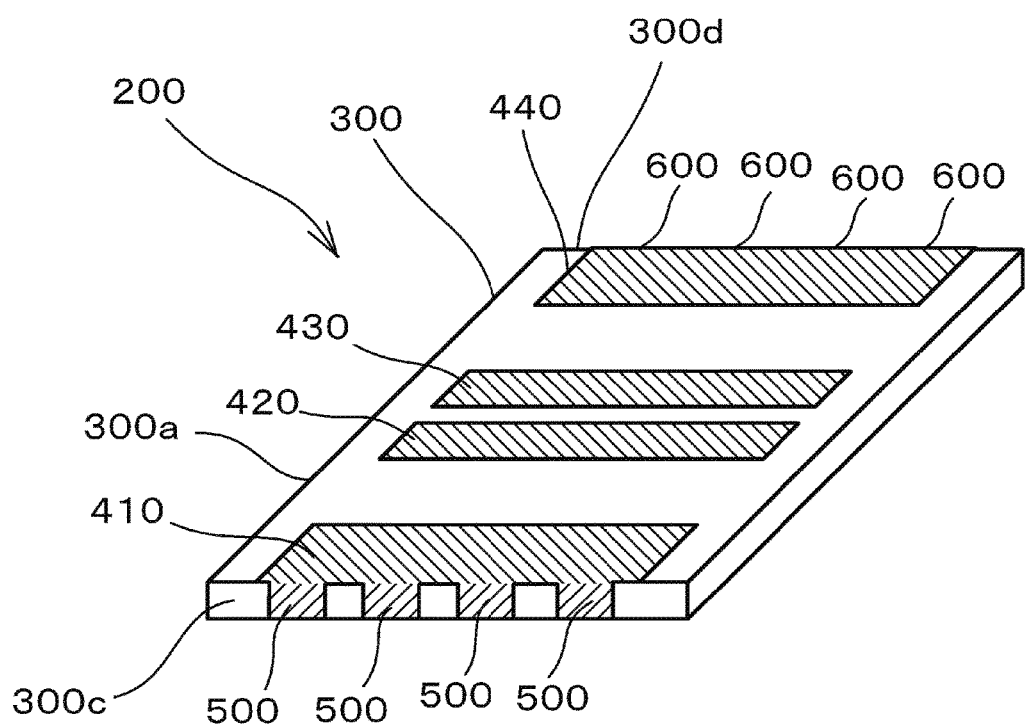
FIG. 10 is a perspective view of an interposer board of a capacitor component in a second preferred embodiment of the present invention.
Figure 11A:
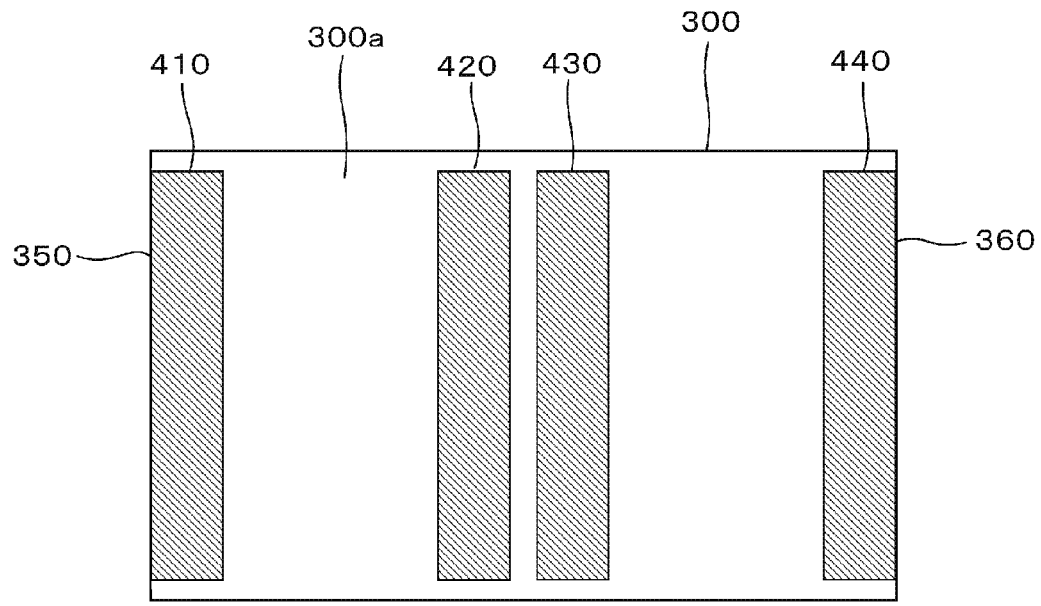
FIG. 11A illustrates a front surface of an interposer board of a capacitor component in the second preferred embodiment of the present invention, and FIG. 11B illustrating a back surface thereof.
Figure 11B:
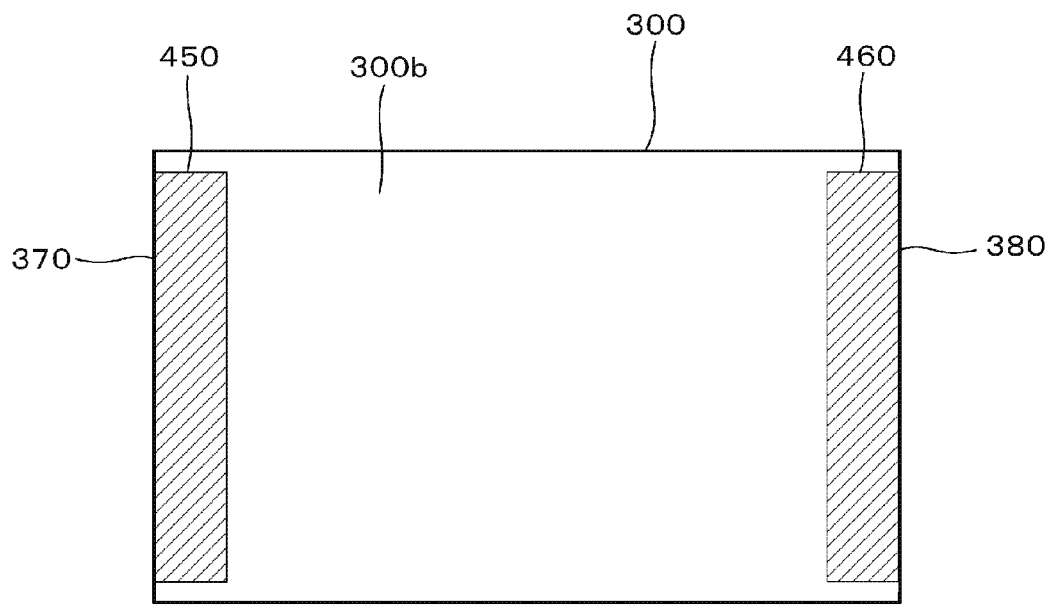

FIG. 10 is a perspective view of the interposer board 300 of the capacitor component 200 in the second preferred embodiment. FIG. 11A illustrates a front surface 300a of the interposer board 300, and FIG. 11B illustrates a back surface 300b thereof.

On the front surface 300a of the front interposer board 300, a first land 410, a second land 420, a third land 430, and a fourth land 440 are provided. On the back surface 300b of the interposer board 300, an input terminal 450 and an output terminal 460 are provided.

The first land 410 extends to a first end edge 350 of the interposer board 300 in its longitudinal direction (refer to FIG. 11A). That is, in the longitudinal direction of the interposer board 300, a distance between the first land 410 and the first end edge 350 of the interposer board 300 is zero or substantially zero.

The fourth land 440 extends to a second end edge 360 opposite to the first end edge 350 in the longitudinal direction of the interposer board 300 (refer to FIG. 11A). That is, in the longitudinal direction of the interposer board 300, a distance between the fourth land 440 and the second end edge 360 of the interposer board 300 is zero or substantially zero.

The input terminal 450 is provided on the back surface 300*b* of the interposer board 300 and extends to an end edge 370 in the longitudinal direction of the interposer board 300 (refer to FIG. 11B). The output terminal 460 is provided on the back surface 300*b* of the interposer board 300 and extends to an end edge 380 of the interposer board 300 (refer to FIG. 11B).

In a first side surface 300*c* of the interposer board 300 on a first end edge 350 side, fifth via conductors 500 are provided while being exposed to electrically connect the first land 410 and the input terminal 450 to each other. The fifth via conductors 500 correspond to the first via conductor 51 described in the first preferred embodiment, and have a shape acquired by cutting the first via conductor 51 along its axial direction. While four of the fifth via conductors 500 are preferably provided in the present preferred embodiment, three or less of the fifth via conductors 500, or five or more of the fifth via conductors 500, may be provided, for example.

The fifth via conductors 500 provided on the first side surface 300*c* of the interposer board 300 are electrically connected to the input terminal 45, and also defines an input terminal. Thus, the input terminal extends from the back surface 300*b* of the interposer board 300 to the first side surface 300*c* thereof.

That is, the input terminal extends from the back surface 300*b* of the interposer board 300 to the first side surface 300*c* thereof in the capacitor component 200 in the present preferred embodiment, and includes a portion provided on the first side surface 300*c*, being defined by the fifth via conductors 500 exposed to the first side surface 300*c*.

In a second side surface 300*d* opposite to the first side surface 300*c* of the interposer board 300, sixth via conductors 600 are provided to electrically connect the fourth land 440 and the output terminal 460 to each other. The sixth via conductors 600 correspond to the fourth via conductor 54 described in the first preferred embodiment, and has a shape acquired by cutting the fourth via conductor 54 along its axial direction. While four of the sixth via conductors 600 are preferably provided in the present preferred embodiment, three or less of the sixth via conductors 600, or five or more of the sixth via conductors 600, may be provided, for example.

The sixth via conductors 600 provided on the second side surface 300*d* of the interposer board 300 are electrically connected to the output terminal 460, and also define an output terminal. Thus, the output terminal extends from the back surface 300*b* of the interposer board 300 to the second side surface 300*d*.

That is, the output terminal extends from the back surface 300*b* of the interposer board 300 to the second side surface 300*d* of the capacitor component 200 in the present preferred embodiment, and includes a portion provided on the second side surface 300*d*, being defined by the sixth via conductors 600 exposed to the second side surface 300*d*.

In the capacitor component 200 in the second preferred embodiment, the input terminal and the output terminal are also preferably provided on the corresponding side surfaces of the interposer board 300, so that mounting of the capacitor component 200 to a mounting board is facilitated.

For example, the capacitor component 100 in the first preferred embodiment needs to be mounted by soldering the input terminal 45 and the output terminal 46, provided on the back surface 30*b* of the interposer board 30, to the corresponding mount lands of a mounting board, for example.

However, in the capacitor component 200 in the second preferred embodiment, the input terminal and the output terminal are provided not only in the back surface 300*b* of the interposer board 300 but also in the corresponding side surfaces thereof, so that each of the input terminal and the output terminal, provided on the corresponding side surfaces of the interposer board 30, are able to be soldered to a mounting board. For example, the input terminal and the output terminal provided on the corresponding side surfaces of the interposer board 300 is able to be soldered to the corresponding mount lands of a mounting board while the capacitor component 200 is mounted on the mounting board, so that mounting of the capacitor component 200 is facilitated.

In the capacitor component 100 in the first preferred embodiment, the capacitor component 100 does not need to include a solder fillet in its side surface, so that another electronic component may be mounted close to the capacitor component 100, for example.

Modified Structure of Second Preferred Embodiment

The capacitor component 200 in the second preferred embodiment described above is configured to enable a side surface of an interposer board to be soldered to a mount land of a mounting board. In contrast, a capacitor component may also preferably be configured to enable a front surface of an interposer board to be soldered to a mount land of a mounting board.

Figure 12:
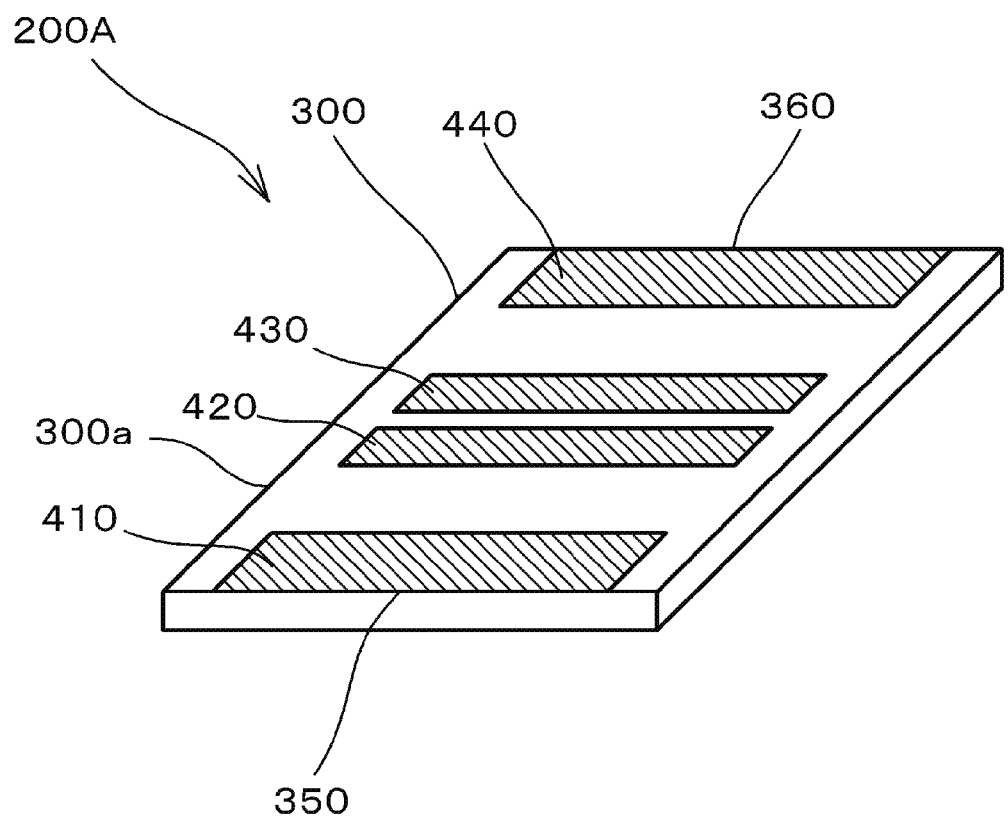
FIG. 12 is a perspective view of an interposer board of a capacitor component with a modified structure in which a fifth via conductor and a sixth via conductor are eliminated from the capacitor component in the second preferred embodiment of the present invention.

FIG. 12 is a perspective view of an interposer board 300 of a capacitor component 200A with a modified structure in which a fifth via conductor 500 and a sixth via conductor 600 are eliminated from the capacitor component 200 in the second preferred embodiment.

A first land 410 provided on a front surface 300*a* of the interposer board 300 extends to a first end edge 350, and a fourth land 440 extends to a second end edge 360. This facilitates soldering between the first land 410 of the interposer board 300 and a mount land of a mounting board as well as between the fourth land 440 thereof and a mount land of the mounting board, so that mounting of the capacitor component 200A to the mounting board is facilitated.

The present invention is not limited to the preferred embodiments described above, and various applications and modifications may be added within the scope of the present invention.

For example, a plurality of multilayer ceramic capacitors mounted on an interposer board are not limited to the same or substantially the same size, and may be different sizes. That is, when a land is provided on an interposer board in accordance with a size of a multilayer ceramic capacitor to be mounted, multilayer ceramic capacitors having various sizes are able to be mounted on the interposer board. As a result, multilayer ceramic capacitors having various sizes are able to be easily mounted on a mounting board using an interposer board.

A connection configuration of a plurality of multilayer ceramic capacitors mounted on an interposer board is not limited to a parallel connection.

While the input terminal 45 and the output terminal 46 are described based on the premise that they are provided on a back surface of an interposer board, they may be provided on a surface other than the back surface, such as a side surface.

While the capacitor component 200 in the second preferred embodiment has a structure in which the fifth via conductors 500 electrically connecting the first land 410 and the input terminal 450 also define an input terminal, an input terminal may also be provided on a side surface of an interposer board without including the above-described structure. For example, the capacitor component 100 in the first preferred embodiment may have a structure in which the input terminal 45 provided on the back surface 30b of the interposer board 30 extends to a side surface thereof. Likewise, the capacitor component 100 in the first preferred embodiment may have a structure in which the output terminal 46 provided on the back surface 30b of the interposer board 30 extends to a side surface thereof.

A structure of a multilayer ceramic capacitor is not limited to the structure illustrated in each of FIGS. 2 and 3.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A capacitor component comprising:
a plurality of multilayer ceramic capacitors; and
an interposer board on which the plurality of multilayer ceramic capacitors are mounted; wherein
the interposer board includes:
   at least four lands that are electrically connected to respective external electrodes of the corresponding plurality of multilayer ceramic capacitors;
   an input terminal; and
   an output terminal;
each of the at least four lands is electrically connected to one of the input terminal and the output terminal;
the at least four lands are provided on a front surface of the interposer board;
each of the input terminal and the output terminal is provided on a back surface of the interposer board opposite to the front surface;
the input terminal extends from the back surface to a first side surface of the interposer board; and
the output terminal extends from the back surface to a second side surface opposite to the first side surface.

2. The capacitor component according to claim 1, wherein
the input terminal includes a portion that is provided on the first side surface to electrically connect the lands provided on the front surface of the interposer board and the input terminal to each other, and is defined by a via conductor that is exposed to the first side surface; and
the output terminal includes a portion that is provided on the second side surface to electrically connect the lands provided on the front surface of the interposer board and the output terminal to each other, and is defined by a via conductor that is exposed to the second side surface.

3. The capacitor component according to claim 1, wherein
at least one of the lands being electrically connected to the input terminal extends to a first end edge of the interposer board; and
at least one of the lands being electrically connected to the output terminal extends to a second end edge opposite to the first end edge of the interposer board.

4. The capacitor component according to claim 1, wherein
the interposer board has a dimension not less than about 3.5 mm and not more than about 10.0 mm in a longitudinal direction, and a dimension not less than about 2.8 mm and not more than about 5.0 mm in a lateral direction orthogonal or substantially orthogonal to the longitudinal direction; and
a ratio of the dimension in the longitudinal direction to the dimension in the lateral direction is not less than about 1.2 and not more than about 2.0.

5. The capacitor component according to claim 1, wherein
the plurality of multilayer ceramic capacitors include a first multilayer ceramic capacitor and a second multilayer ceramic capacitor;
the first multilayer ceramic capacitor is electrically connected to first and second lands of the at least four lands; and
the second multilayer ceramic capacitor is electrically connected to third and fourth lands of the at least four lands.

6. The capacitor component according to claim 5, wherein the first and second multilayer ceramic capacitors are connected to one another in parallel.

7. A capacitor component comprising:
a plurality of multilayer ceramic capacitors; and
an interposer board on which the plurality of multilayer ceramic capacitors are mounted; wherein
the interposer board includes:
   at least four lands that are electrically connected to respective external electrodes of the corresponding plurality of multilayer ceramic capacitors;
   an input terminal; and
   an output terminal;
each of the at least four lands is electrically connected to one of the input terminal and the output terminal;
the plurality of multilayer ceramic capacitors include first, second, third and fourth multilayer ceramic capacitors;
the first and second multilayer ceramic capacitors are each electrically connected to first and second lands of the at least four lands; and
the third and fourth multilayer ceramic capacitors are each electrically connected to third and fourth lands of the at least four lands.

8. The capacitor component according to claim 7, wherein the first, second, third, fourth multilayer ceramic capacitors are connected to one another in parallel.

9. The capacitor component according to claim 1, wherein each of the plurality of multilayer ceramic capacitors includes:
a laminate including a plurality dielectric layers made of dielectric ceramics;
a plurality of first internal electrodes that extend to a first end surface of the laminate; and
a plurality of second internal electrodes that extend to a second end surface of the laminate; and
the plurality of dielectric layers, and the plurality of first and second internal electrodes, are alternately stacked to define the laminate.

10. The capacitor component according to claim 9, wherein each of the plurality of multilayer ceramic capacitors includes:
a first external electrode provided on the first end surface of the laminate and electrically connected to the plurality of first internal electrodes; and
a second external electrode provided on the second end surface of the laminate and electrically connected to the plurality of second internal electrodes.

11. The capacitor component according to claim 10, wherein
the first external electrode extends to a first principal surface, a second principal surface, a first side surface, and a second side surface of the laminate from the first end surface; and
the second external electrode extends to the first principal surface, the second principal surface, the first side surface, and the second side surface of the laminate from the second end surface.

12. A capacitor component comprising:
a plurality of multilayer ceramic capacitors; and
an interposer board on which the plurality of multilayer ceramic capacitors are mounted; wherein
the interposer board includes:
at least four lands that are electrically connected to respective external electrodes of the corresponding plurality of multilayer ceramic capacitors;
an input terminal; and
an output terminal;
each of the at least four lands is electrically connected to one of the input terminal and the output terminal; and
the interposer board includes a first board, a second board, and a third board that are stacked.

13. The capacitor component according to claim 12, wherein
the at least four lands are provided on a front surface of the first board;
the input terminal and the output terminal are provided on a back surface of the third board; and
the second board is disposed between the first board and the third board.

14. The capacitor component according to claim 12, wherein the input terminal and the output terminal are electrically connected to respective ones of the at least four lands by via conductors that extend through at least one of the first, second, and third boards.

15. The capacitor component according to claim 1, wherein each of the at least four lands has a width of about 0.5 mm.

16. A capacitor component comprising:
a plurality of multilayer ceramic capacitors; and
an interposer board on which the plurality of multilayer ceramic capacitors are mounted; wherein
the interposer board includes:
at least four lands that are electrically connected to respective external electrodes of the corresponding plurality of multilayer ceramic capacitors;
an input terminal; and
an output terminal;
each of the at least four lands is electrically connected to one of the input terminal and the output terminal;
the plurality of multilayer ceramic capacitors include a first multilayer ceramic capacitor and a second multilayer ceramic capacitor;
the first multilayer ceramic capacitor is electrically connected to first and second lands of the at least four lands;
the second multilayer ceramic capacitor is electrically connected to third and fourth lands of the at least four lands;
a distance between the first land and the second land in a longitudinal direction of the interposer board is about 2.4 mm;
a distance between the third land and the fourth land in the longitudinal direction of the interposer board is about 2.4 mm; and
a distance between the second land and the third land in the longitudinal direction of the interposer board is about 0.3 mm.

17. The capacitor component according to claim 16, wherein, in the longitudinal direction of the interposer board, a distance between the first land and a first end edge of the interposer board and a distance between the fourth land and a second end edge of the interposer board opposite to the first end edge is about 0.1 mm.

18. The capacitor component according to claim 17, wherein, in a lateral direction of the interposer board orthogonal or substantially orthogonal to the longitudinal direction, a distance between each of the first, second, third, and fourth lands and each of a third end edge and a fourth end edge of the interposer board is about 0.15 mm.

* * * * *